(12) United States Patent
Mortensen et al.

(10) Patent No.: US 8,635,756 B2
(45) Date of Patent: Jan. 28, 2014

(54) ADJUSTABLE EMI BAFFLING METHOD FOR DATA STORAGE SYSTEMS

(75) Inventors: Justin B. Mortensen, Wichita, KS (US); Robert Harvey, Wichita, KS (US)

(73) Assignee: Netapp, Inc., Sunnyvale, CA (US)

( * ) Notice: Subject to any disclaimer, the term of this patent is extended or adjusted under 35 U.S.C. 154(b) by 1078 days.

(21) Appl. No.: 12/605,056

(22) Filed: Oct. 23, 2009

(65) Prior Publication Data
US 2010/0037448 A1 Feb. 18, 2010

Related U.S. Application Data

(62) Division of application No. 11/634,064, filed on Dec. 5, 2006, now Pat. No. 7,667,984.

(51) Int. Cl.
*B23P 11/00* (2006.01)
(52) U.S. Cl.
USPC .............................. 29/428; 29/592.1; 29/825
(58) Field of Classification Search
USPC ........................................ 29/592.1, 825, 428
See application file for complete search history.

(56) References Cited

U.S. PATENT DOCUMENTS

| 6,330,167 | B1 | 12/2001 | Kobayashi |
| 7,119,286 | B1 | 10/2006 | Horng |
| 7,215,536 | B2 * | 5/2007 | Hensley et al. ............... 361/816 |
| 7,667,984 | B2 * | 2/2010 | Mortensen et al. ........... 361/818 |
| 2004/0120130 | A1 * | 6/2004 | Hensley et al. ............... 361/818 |
| 2004/0212973 | A1 | 10/2004 | Ice |
| 2006/0256534 | A1 | 11/2006 | Garnett et al. |
| 2008/0130215 | A1 * | 6/2008 | Mortensen et al. ........... 361/684 |
| 2010/0037448 | A1 * | 2/2010 | Mortensen et al. ............. 29/428 |

* cited by examiner

*Primary Examiner* — Carl Arbes
(74) *Attorney, Agent, or Firm* — Haynes and Boone, LLP

(57) ABSTRACT

The present invention is directed to an apparatus for reducing and constraining EMI (electronic magnetic radiation) emissions without affecting the internals of data storage system components. A baffle is attached to the exterior of the housing of a data storage system component by baffle mounts. The baffle is operable between a closed position, where the baffle blocks EMI emitted by connectors on the data storage system component, and an open position, where the connectors are not blocked allowing for servicing and cable management. The baffle may comprise an EMI absorbing material and be tuned to meet specific EMI requirements. The baffle mounts offsets the baffle from the data storage system component and the baffle includes a number of holes to allow airflow. The adjustable EMI baffling apparatus does not interfere with other mounted components while the data storage system component is mounted in a cabinet.

20 Claims, 6 Drawing Sheets

ADJUSTABLE EMI BAFFLING METHOD FOR DATA STORAGE SYSTEMS

CROSS-REFERENCE TO RELATED APPLICATIONS

The present application is a divisional application of and claims priority under 35 U.S.C. §121 to U.S. application Ser. No. 11/634,064 entitled: Adjustable EMI Baffling Apparatus For Data Storage Systems filed Dec. 5, 2006. The U.S. application, Ser. No. 11/634,064 herein incorporated by reference in its entirety.

FIELD OF THE INVENTION

This invention relates generally to the field of computer systems and configurations, and particularly to an adjustable EMI baffling apparatus for data storage systems.

BACKGROUND OF THE INVENTION

Electronic enclosures including data storage systems frequently emit undesirable electronic magnetic radiation, commonly referred to as electromagnetic interference (EMI). The ever increasing complexity of modern computer systems and information networks has made the ability to comply with EMI emission requirements more difficult. For example, increased higher operating frequencies have resulted in increased EMI emissions from computer systems. In some cases, large amounts of energy are released at the interconnect location of the system to the outside world. This includes at the location of interconnect technologies such as SFP (small form factor pluggable) cages for fiber optic pluggable transceivers. These connector housings are typically internally shielded, but are known sources of EMI, making enclosure shielding difficult.

Regulations set forth by the Federal Communications Commission (FCC) do not permit products to emit EMI above pre-defined thresholds. Thus, containment and reduction of EMI is required for a variety of information handling system components, including data storage systems, in order for such systems to be certified by the FCC.

Several methods currently exist for EMI reduction and containment in data storage systems. One conventionally utilized method for EMI reduction and containment is the use of various gaskets and shields that are installed in high EMI emitting locations throughout the system. In addition, enclosure designs are configured to reduce the amount of seams and gaps that can act as transmitters for EMI. Board level shielding approaches entail the use of faraday cages located over and above high energy PCB (printed circuit board) components.

Common disadvantages associated with the currently available methods entail increased part counts, increased costs, and increased assembly labor rates. Ultimately, designers are limited in the approaches to EMI shielding. Limited space for internal shields, higher chip frequencies, and other design constraints leave little alternatives for EMI shielding and gaining FCC compliance.

Therefore, it would be desirable to reduce and constrain EMI in accordance with desired standards without affecting the internals of the data/computer system.

SUMMARY OF THE INVENTION

Accordingly, the present invention provides an apparatus for reducing and constraining EMI emissions without affecting the internals of information handling system components.

In an exemplary aspect of the present invention, an adjustable EMI baffling apparatus may be attached by baffle mounts to the exterior of the housing of a data storage system component. A baffle is attached to the baffle mounts, operable between a closed position and an open position. In the closed position, the baffle blocks EMI emitted by connectors on the data storage system component. In the open position, the connectors are not blocked allowing for servicing and cable management. The baffle in the closed position impedes EMI radiation emitted by the connectors, thus containing and reducing EMI emission. The baffle may comprise an EMI absorbing material and may be tuned to meet specific EMI requirements, such as FCC regulations. The baffle mounts offset the baffle from the data storage system component to allow airflow. The baffle includes a number of holes to also allow airflow. If the data storage system component is mounted in a cabinet, the adjustable EMI baffling apparatus does not interfere with other mounted components.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring now to FIGS. 1-5, an adjustable EMI (electronic magnetic radiation) baffling apparatus 100 in accordance with an exemplary embodiment of the present invention is illustrated. Referring now to FIGS. 1-4, the adjustable EMI baffling apparatus 100 may be attached to the exterior of the housing of an information handling system component 101 as shown. The information handling system component 101 includes one or more connectors 102. The connectors 102 may be SFP (small form factor pluggable) cages for fiber optic pluggable transceivers. The information handling system component 101 may be a data storage system component. The information handling system component 101 may be mountable in an information handling system component chassis. The information handling system component chassis may be a computer cabinet, which may be a standard EIA (Electronic Industries Alliance) cabinet. If the information handling system component is mounted in an information handling system component chassis, the adjustable EMI baffling apparatus 100 does not interfere with other information handling system components mounted in the information handling system component chassis.

Figure 3:
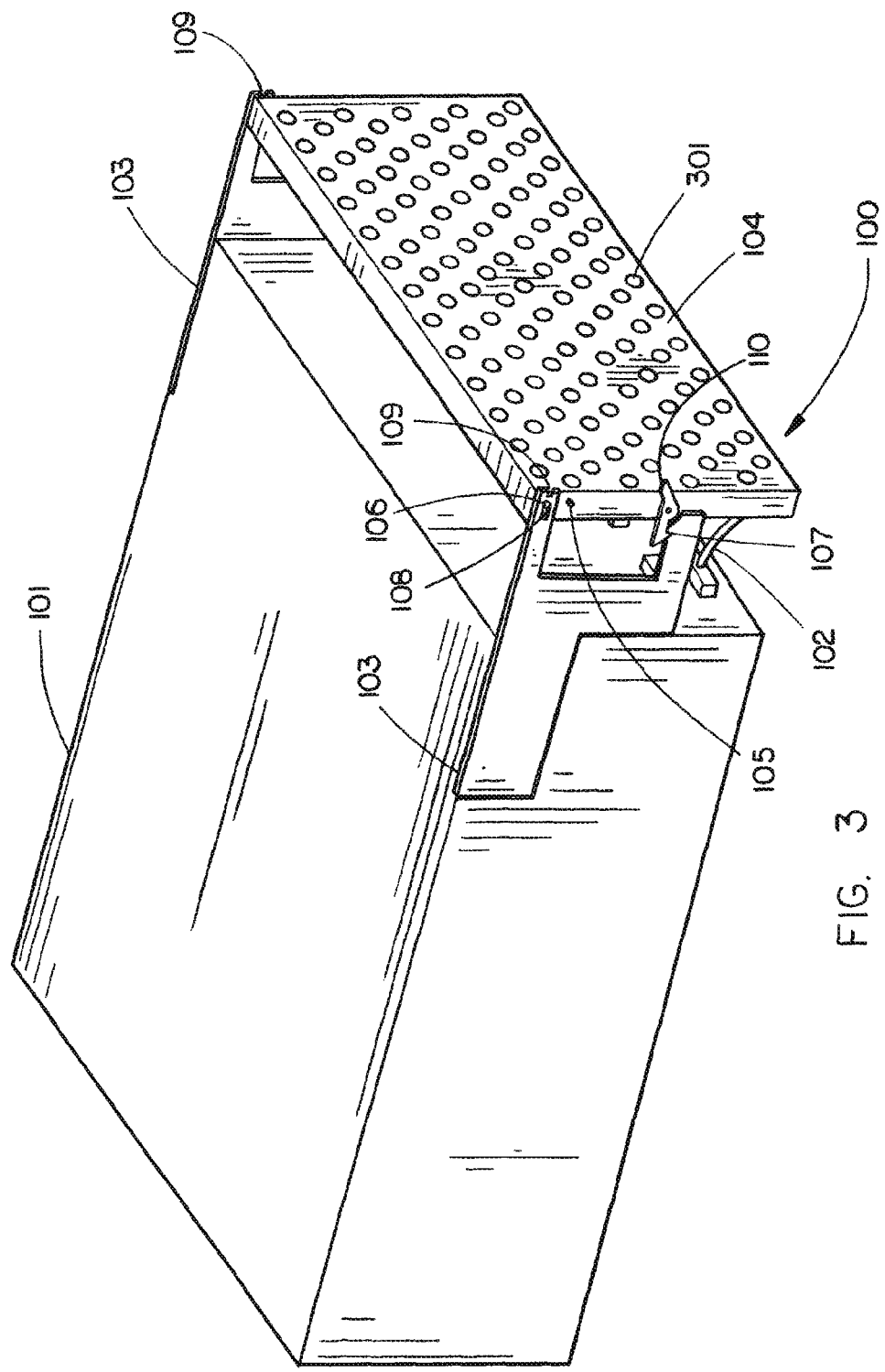
FIG. 3 is an isometric view of an adjustable EMI baffling apparatus attached to an information handling system component in accordance with an exemplary embodiment of the present invention, wherein the baffle is in the closed or storage position.
Figure 4:
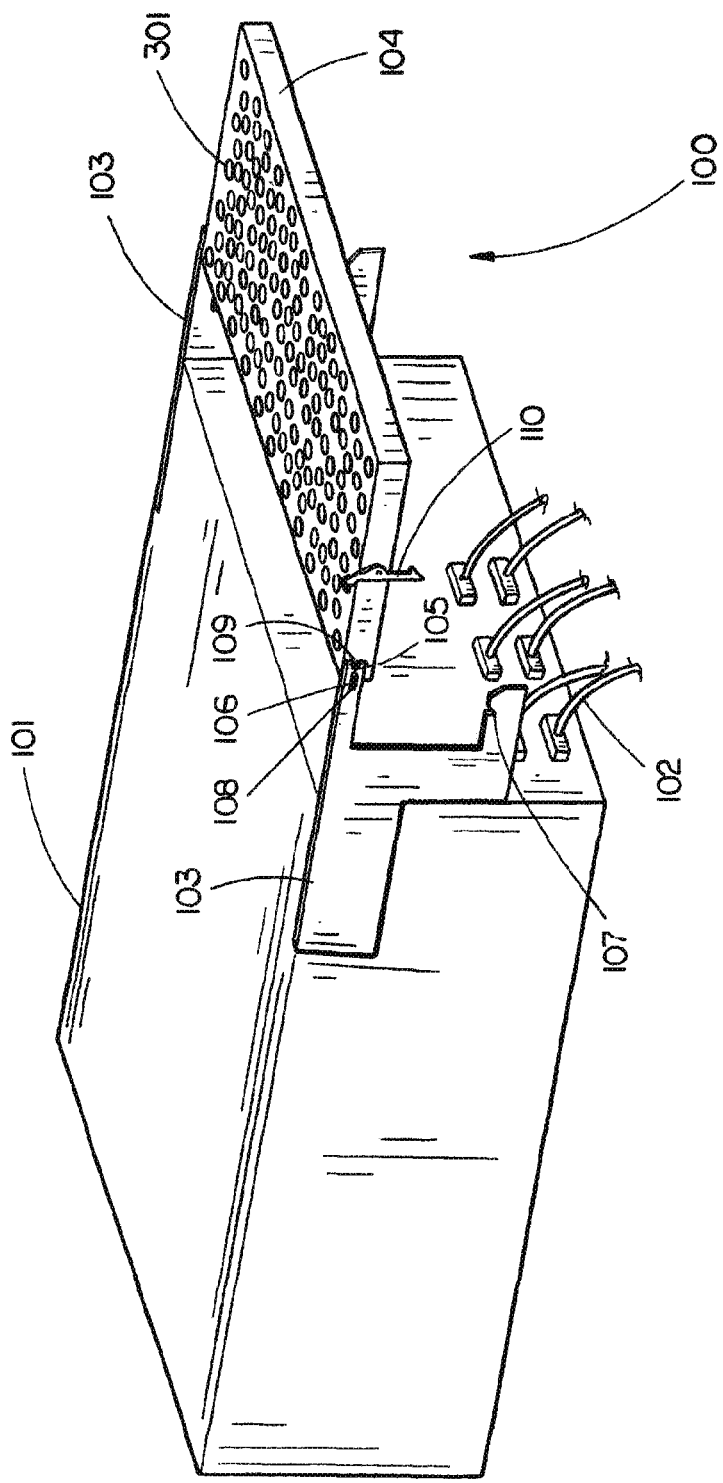
FIG. 4 is an isometric view of an adjustable EMI baffling apparatus attached to an information handling system component in accordance with an exemplary embodiment of the present invention, wherein the baffle is in the open position for accessibility and cable management.

Referring now to FIGS. 3 and 4, in this embodiment the adjustable EMI baffling apparatus 100 is attached to the information handling system component 101 by a pair of baffle mounts 103. The baffle mounts 103 may comprise sheet metal. In alternative embodiments of the present invention, the adjustable EMI baffling apparatus 100 may attach to an information handling system component 101 utilizing a different number of baffle mounts 103. For example, in an alternative embodiment of the present invention one or three baffle mounts 103 could be utilized.

Figure 1:
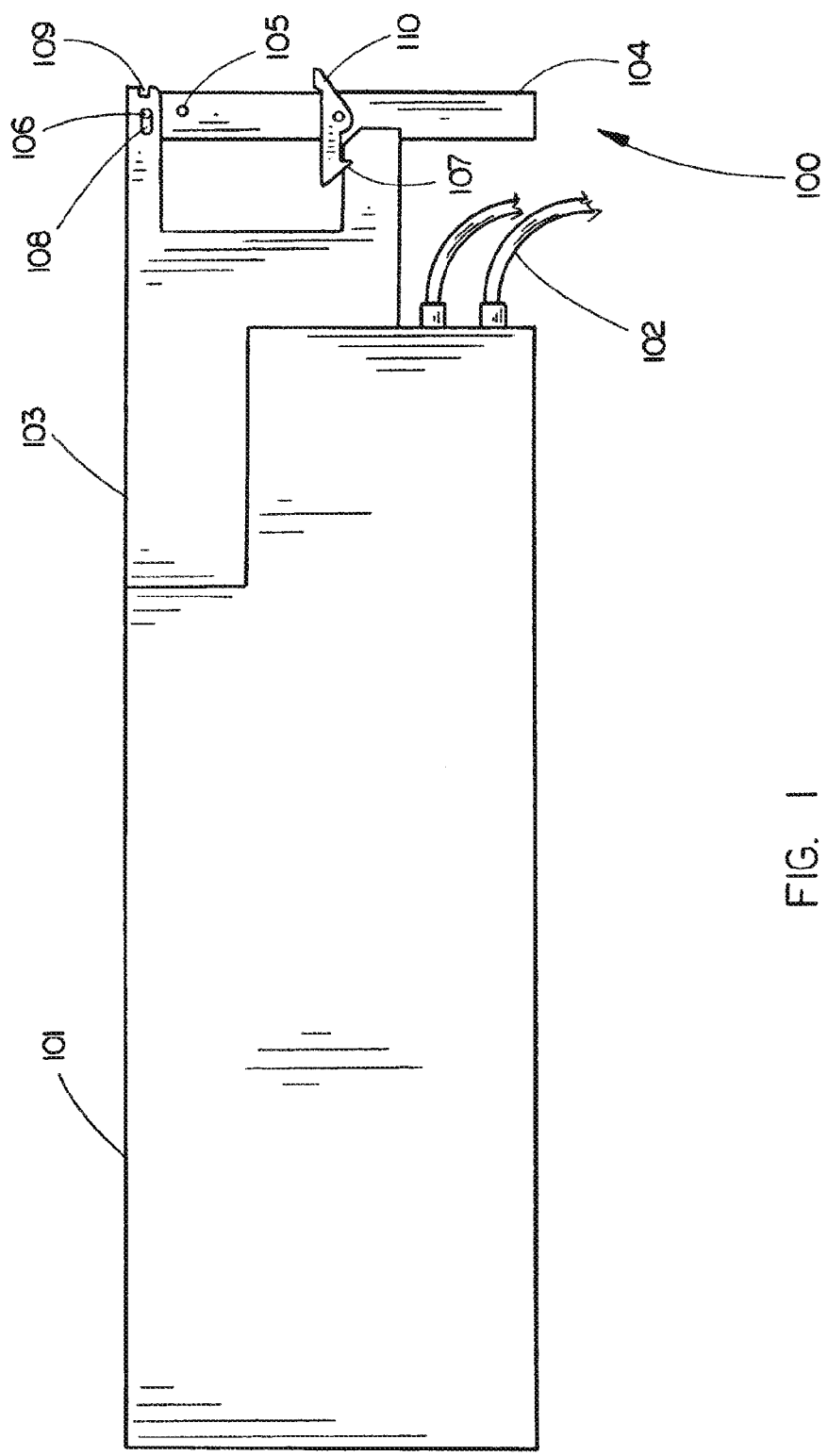
FIG. 1 is a side view of an adjustable EMI baffling apparatus attached to an information handling system component in accordance with an exemplary embodiment of the present invention, wherein the baffle is in the closed or storage position.
Figure 2:
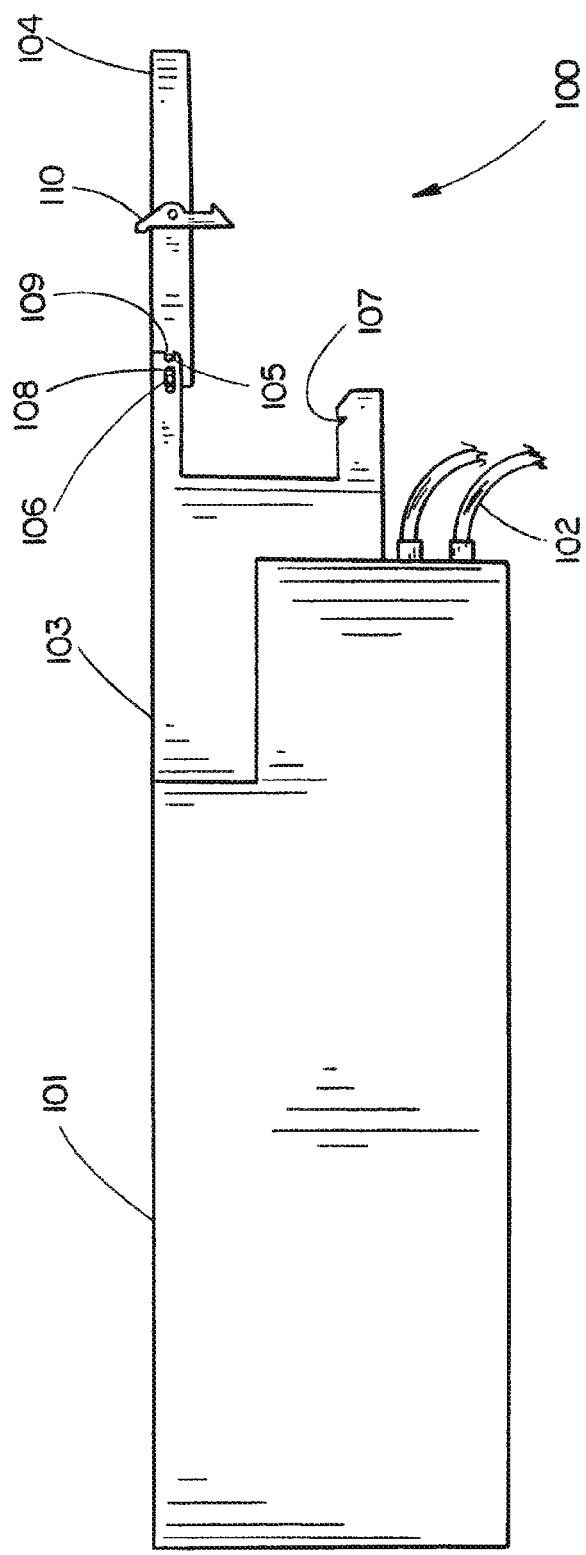
FIG. 2 is a side view of an adjustable EMI baffling apparatus attached to an information handling system component in accordance with an exemplary embodiment of the present invention, wherein the baffle is in the open position for accessibility and cable management.
Figure 5:
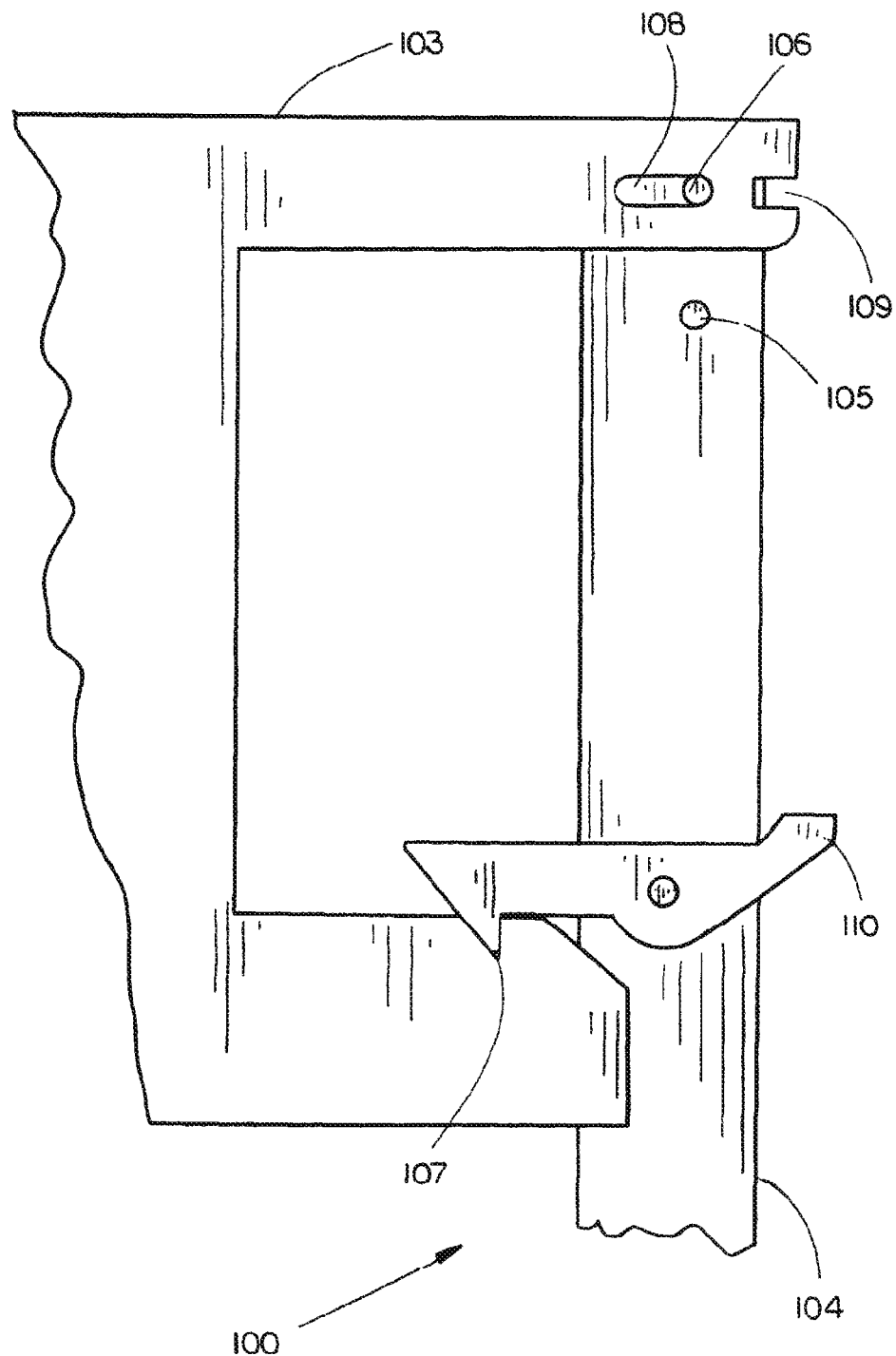
FIG. 5 is a detail side view of an adjustable EMI baffling apparatus in accordance with an exemplary embodiment of the present invention.

Referring now to FIGS. 1-4, a baffle 104 is moveably attached to the baffle mounts 103. The baffle 104 is operable between a closed position (as illustrated in FIGS. 1, 3 and 5) and an open position (as illustrated in FIGS. 2 and 4). In the closed position (as illustrated in FIGS. 1 and 3), the baffle 104 blocks EMI emitted by at least one connector 102 on the information handling system component 101. In the open position (as illustrated in FIGS. 2 and 4), the baffle 104 does not block one or more connectors 102 on the information handling system component 101, allowing for servicing of the connectors 102 and cable management. The blocking of the connector 102 by the baffle 104 impedes EMI emitted by the connector 102, thus containing and reducing EMI emission. The baffle 104 may comprise different materials (including EMI absorbing materials), gauges, and thicknesses for containment and reduction of specific EMI frequencies. The baffle 104 may comprise sheet metal. Thus, the baffle 104 may be tuned to meet specific EMI requirements, such as FCC (Federal Communications Commission) regulations.

Referring now to FIG. 3, in this exemplary embodiment the baffle mounts 103 offset the baffle 104 from the information handling system component 101 to allow airflow to and from the information handling system component 101. Also in this embodiment, the baffle 104 includes a number of holes 301 to allow airflow to and from the information handling system component 101.

Referring now to FIG. 5, the moveable attachment of the baffle 104 to the baffle mounts 103 will now be described. The baffle 104 includes notch pins 105, a slot pins 106, and latches 110. The baffle mounts 103 include latch notches 107, pin slots 108, and pin notches 109. The baffle 104 is held between baffle mounts 103. Slot pins 106 protrude through pin slots 108 so that the baffle 104 is moveably connected to the baffle mounts 103. When the baffle 104 is in the closed position (as illustrated in FIG. 5), latches 110 engage latch notches 107 to restrain the movement of the baffle 104. Latches 110 may be disengaged from latch notches 107 so that the baffle 104 may rotate on slot pins 106 to the open position (as illustrated in FIGS. 2 and 4). When the baffle 104 is rotated to the open position (as illustrated in FIGS. 2 and 4), the baffle 104 may be pushed inward toward the baffle mounts 103 so that slot pin 106 slides along pin slot 108 and notch pins 105 are slid into pin notches 109. When the baffle 104 has been pushed inward toward the baffle mounts 103 so that notch pins 105 are slid into pin notches 109, pin notches 109 and notch pins 105 hold the baffle 104 in place. When the baffle 104 is held in place in the open position (as illustrated in FIGS. 2 and 4) by pin notches 109 and notch pins 105, the baffle 104 may be pulled away from the baffle mounts 103 so that slot pin 106 slides along pin slot 108 and notch pins 105 are slid out of pin notches 109. The baffle 104 may then be rotated to the closed position (as illustrated in FIGS. 1, 3, and 5) and the baffle 104 may be pushed inward toward the baffle mounts 103 so that latches 110 engage latch notches 107.

In alternative embodiments, the baffle 104 may be moveably connected to the baffle mounts 103 utilizing different connection means. For example, hinges may be utilized. Also, in alternative embodiments a different number of latches 110 may be utilized. For example, one latch 110 may be utilized or no latches 110 may be utilized. Additionally, in alternative embodiments the baffle 104 may be moveably connected to the baffle mounts 103 so that the baffle 104 moves differently between the closed and open positions. For example, the baffle 104 may swing side to side instead of swinging up and down. Additionally, in alternative embodiments, the baffle 104 may be operable between two or more positions that are not closed and open positions.

Figure 6:
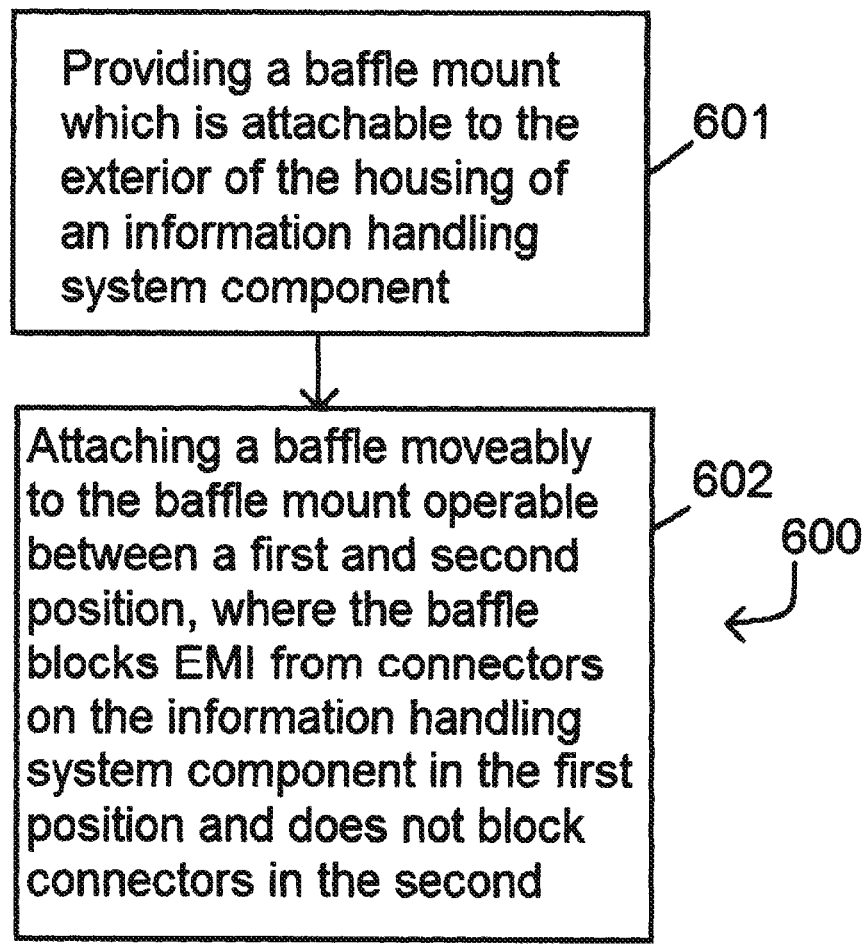
FIG. 6 is a flow chart of a method for providing an adjustable EMI baffling apparatus for an information handling system component in accordance with an exemplary embodiment of the present invention.

Referring now to FIG. 6, a method for providing an adjustable EMI baffling apparatus for an information handling system component including at least one connector 600 in accordance with an exemplary embodiment of the present invention is illustrated. In step 601, a baffle mount which is attachable to the exterior of the housing of an information handling system component is provided. In step 602, a baffle is moveably attached to the baffle mount so that the baffle is operable between a first and second position where the baffle blocks EMI emitted by one or more connectors on the information handling system component in the first position and does not block one or more connectors on the information handling system component in the second position.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:
1. A method of providing an adjustable EMI (electronic magnetic radiation) baffling apparatus for an information handling system component with at least one connector, comprising:

providing a baffle mount which is attachable to the exterior of the housing of an information handling system component, attaching a baffle moveably to the baffle mount so the baffle is operable between a first and second position wherein in the first position the baffle blocks EMI emitted by at least one connector on the information handling system component and in the second position the baffle does not block one or more connectors on the information handling system component; further wherein the baffle rotates on a slot pin between the first position and the second position, and wherein the baffle engages a latch notch in the first position.

2. The method as claimed in claim 1, wherein the baffle comprises an EMI absorbing material.

3. The method as claimed in claim 2, wherein the baffle has been tuned to Meet government regulations.

4. The method as claimed in claim 1, wherein the baffle includes a number of holes for airflow.

5. The method as claimed in claim 1, wherein the baffle mount offsets the baffle from the information handling system component for airflow.

6. The method as claimed in claim 1, wherein the information handling system component is mountable in a information handling system component chassis and the baffle and baffle mount do not interfere with other information handling system components mounted in the information handling system component chassis.

7. The method as claimed in claim 1, wherein the information handling system component is a data storage system component.

8. The method as claimed in claim 1, wherein the baffle comprises an EMI absorbing material.

9. The method as claimed in claim 1, wherein the baffle engages a latch notch in the first position.

10. The method as claimed in claim 1, wherein the baffle mount offsets the baffle from the information handling system component for airflow.

11. The method as claimed in claim 1, wherein the information handling system component is mountable in a component chassis and the baffle and baffle mount do not interfere with other information handling system components mounted in the chassis.

12. The method as claimed in claim 1, wherein the pluggable transceiver connector includes a fiber optic pluggable connector.

13. A method of providing an adjustable EMI (electronic magnetic radiation) baffle for an information handling system component with a connector, comprising:

providing a baffle mount which is attachable to an exterior of a housing of the information handling system component, attaching the baffle moveably to the baffle mount so the baffle is operable between a first and second position wherein in the first position the baffle blocks EMI emitted by the connector on the information handling system component and in the second position the baffle does not block the connector; further wherein the baffle rotates between the first position and the second position, and wherein the baffle engages a latch notch in the first position.

14. The method as claimed in claim 13, wherein the baffle comprises an EMI absorbing material.

15. The method as claimed in claim 14, wherein the baffle has been tuned to meet government regulations.

16. The method as claimed in claim 13, wherein the baffle includes a plurality of holes allowing airflow.

17. The method as claimed in claim 13, wherein the baffle mount offsets the baffle from the information handling system component for airflow.

18. The method as claimed in claim 13, wherein the information handling system component is mountable in an information handling system component chassis and the baffle and baffle mount do not interfere with other information handling system components mounted in the information handling system component chassis.

19. The method as claimed in claim 13, wherein the information handling system component is a data storage system component.

20. A method of providing an adjustable EMI (electronic magnetic radiation) blocking apparatus for an information handling system component with a pluggable transceiver connector with EMI emissions, the method comprising:

providing a baffle mount which is attachable to the exterior of the housing of an information handling system component, attaching a baffle moveably to the baffle mount so the baffle is operable between a first and second position wherein in the first position the baffle blocks EMI emitted by at least one connector on the information handling system component and in the second position the baffle does not block one or more connectors on the information handling system component; further wherein the baffle rotates on a pin between the first position and the second position.

* * * * *